(12) United States Patent
Behandish et al.

(10) Patent No.: US 12,377,610 B2
(45) Date of Patent: Aug. 5, 2025

(54) MANUFACTURING METHODS AND SYSTEMS INCLUDING DIGITAL TWIN MANAGING PROCESS, LIFECYCLE, AND INSTANCE

(71) Applicant: Palo Alto Research Center Incorporated, Palo Alto, CA (US)

(72) Inventors: Morad Behandish, San Mateo, CA (US); Matthew Patterson, Raleigh, NC (US); Soren Taverniers, Palo Alto, CA (US); Dogan Timucin, Santa Cruz, CA (US); Christoforos Somarakis, Gilroy, CA (US); Svyatoslav Korneev, San Jose, CA (US)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 18/098,942

(22) Filed: Jan. 19, 2023

(65) Prior Publication Data
US 2024/0246297 A1 Jul. 25, 2024

(51) Int. Cl.
*B29C 64/393* (2017.01)
*B22F 10/85* (2021.01)
(Continued)

(52) U.S. Cl.
CPC ............ *B29C 64/393* (2017.08); *B22F 10/85* (2021.01); *B33Y 10/00* (2014.12); *B33Y 30/00* (2014.12);
(Continued)

(58) Field of Classification Search
CPC ... B29C 64/393; B29C 64/153; B29C 64/386; B29C 64/118; B22F 10/85; B22F 10/28;
(Continued)

(56) References Cited

U.S. PATENT DOCUMENTS

| | | | |
|---|---|---|---|
| 2016/0185048 A1* | 6/2016 | Dave | B33Y 50/02 700/119 |
| 2018/0341248 A1* | 11/2018 | Mehr | G06N 20/10 |

(Continued)

OTHER PUBLICATIONS

Herlyn, W., et al., "Mastering the Supply Chain by a Concept of a Digital Control-Twin", Proceedings of the Hamburg International Conference of Logistics (HICL)—29, published in: Data Science and Innovation in Supply Chain Management, ISBN: 978-3-753123-46-2, Sep. 2020.

(Continued)

*Primary Examiner* — Chun Cao
*Assistant Examiner* — Michael Tang
(74) *Attorney, Agent, or Firm* — Womble Bond Dickinson (US) LLP

(57) ABSTRACT

This disclosure provides techniques for manufacturing parts using digital twin(s) to manage various aspects of the manufacturing system. An example method may include representing a manufacturing system using a digital twin. In some cases, representing the manufacturing system includes modeling, in the digital twin, digital representations that correspond to a number of physical components of the manufacturing system. The physical components include at least: a manufacturing material, a working environment for deposition of the manufacturing material (e.g., for additive manufacturing), a tool to manipulate the manufacturing material between at least two matter states in the working environment, and sensors measuring behaviors of the tool, the working environment, and the manufacturing material. The method may further include receiving a manufacturing production task. The task may include a digital model of a part to be manufactured and default parameters for the manufacturing material(s), the working environment, and the tool.

11 Claims, 12 Drawing Sheets

(51) Int. Cl.
*B33Y 10/00* (2015.01)
*B33Y 30/00* (2015.01)
*B33Y 50/02* (2015.01)
*G05B 19/418* (2006.01)
*B22F 10/28* (2021.01)
*B29C 64/153* (2017.01)

(52) U.S. Cl.
CPC ........ *B33Y 50/02* (2014.12); *G05B 19/41885* (2013.01); *B22F 10/28* (2021.01); *B29C 64/153* (2017.08)

(58) Field of Classification Search
CPC .......... B22F 10/80; B22F 10/22; B22F 10/50; B22F 10/66; B22F 12/90; B33Y 10/00; B33Y 30/00; B33Y 50/02; B33Y 40/20; B33Y 50/00; G05B 19/41885; G05B 19/4069; G05B 19/4099; G06F 30/23; G06F 30/27

USPC .............................................. 700/119, 98, 31
See application file for complete search history.

(56) References Cited

U.S. PATENT DOCUMENTS

| | | | |
|---|---|---|---|
| 2019/0004079 A1* | 1/2019 | Blom | B33Y 50/02 |
| 2019/0184494 A1* | 6/2019 | Bennett | B23K 26/146 |
| 2020/0331209 A1* | 10/2020 | Ong | B29C 64/232 |
| 2020/0398379 A1* | 12/2020 | Reznik | B22F 10/80 |
| 2022/0134433 A1* | 5/2022 | McFarland | B23K 26/342 |
| 2022/0161329 A1* | 5/2022 | Tsai | B22F 10/80 |
| 2024/0033998 A1* | 2/2024 | Stramigioli | B33Y 10/00 |

OTHER PUBLICATIONS

Shaw, K., et al., "What is digital twin and why it's important to IoT", Network Word, Mar. 17, 2022, IDG Communications, Inc.

* cited by examiner

MANUFACTURING METHODS AND SYSTEMS INCLUDING DIGITAL TWIN MANAGING PROCESS, LIFECYCLE, AND INSTANCE

TECHNICAL FIELD

Implementations of the present disclosure relate to manufacturing physical parts.

BACKGROUND

In conventional additive or subtractive manufacturing, production parameters (e.g., temperature, materials, feedrates or nozzle movement speeds, etc.) are selected based on user experiences or rudimentary simulation (e.g., by generating a slicing simulation in a 3D printing gcode creating program). Such selection often oversimplifies variables that may impact the production process unexpectedly (e.g., local heat build-up or adhesion failures due to localized material properties variations). When unexpected events occur, the adjustment is often based on another round of trial-and-error, by terminating the present job and starting a new job. Such trial-and-error processes are often inefficient and produce uncertain results.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

Like numerals indicate like elements.

DETAILED DESCRIPTION

Figure 1:
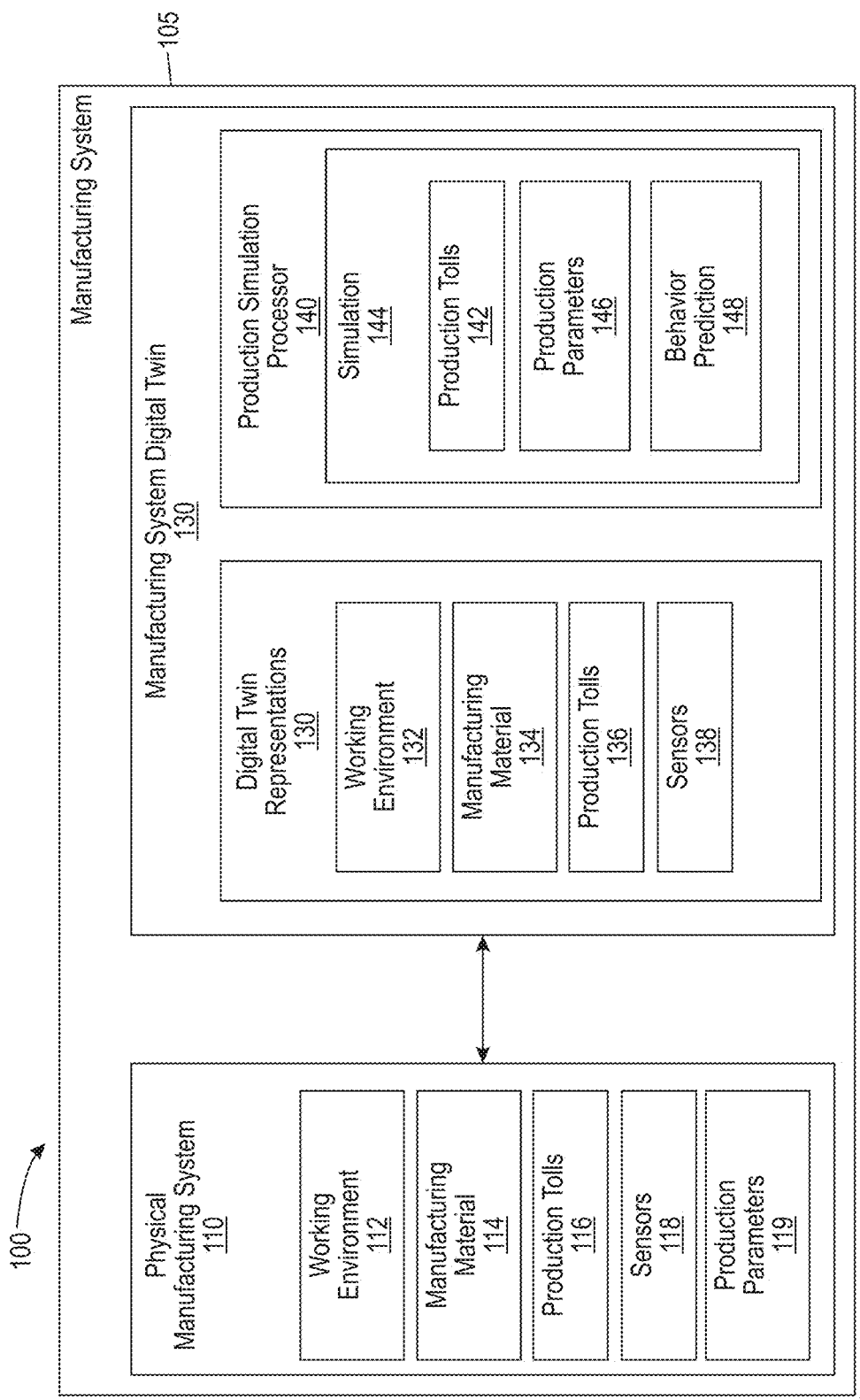
FIG. 1 illustrates a block diagram of a manufacturing system of a physical manufacturing system and its digital twin, in accordance with certain aspects of the present disclosure.

The present disclosure provides various techniques for manufacturing parts using digital twin(s) to manage various aspects of the manufacturing system, including process, lifecycle, and component data thereof. For example, a physical manufacturing system is represented by a digital twin for every pertinent component (e.g., components that affect the manufacturing processes and results). The digital twin may include a process-digital-twin (PDT), a lifecycle-digital-twin (LDT), and an instance-digital-twin (IDT). The PDT includes a virtual (e.g., digital, computational, or the like) representation of the manufacturing process (e.g., environment, tools, and supplies) for manufacturing parts. The LDT includes a virtual representation of the parts (e.g., shape and properties) of a product lifecycle distinct from the manufacturing process. The IDT includes a virtual representation of a specific instance of a manufactured part (e.g., as produced). In other words, the PDT, LDT, and IDT together represent the digital model, the making, and the physical product of a manufactured part. Because the digital twin mirrors the physical counterpart, the digital twin allows for simulation of and updates to the digital model, the making, and the physical product.

For example, when a part is to be manufactured, production parameters may be obtained in the digital twin based on various assumptions (e.g., initial conditions expected to be applied to the physical manufacturing system). The physical manufacturing process is monitored by various sensors and may provide feedback that contradicts the assumptions used in the simulation. Upon receiving such feedback, the digital twin may update or re-execute the simulation based on the feedback to determine a new set of production parameters. The new set of production parameters may then be provided to the physical manufacturing system to improve the manufacturing process.

According to aspects of the present disclosure, an example method may include representing a manufacturing system using a digital twin. In some cases, representing the manufacturing system includes modeling, in the digital twin, digital representations that correspond to a number of physical components of the manufacturing system. The physical components include at least: a manufacturing material, a working environment for deposition of the manufacturing material (e.g., for additive manufacturing), a tool to manipulate the manufacturing material between at least two matter states in the working environment, and sensors measuring behaviors of the tool, the working environment, and the manufacturing material. The method may further include receiving a manufacturing production task. The task may include a digital model of a part to be manufactured and default parameters for the manufacturing material(s), the working environment, and the tool.

The method may further include performing, in the digital twin, a simulation of the manufacturing production task to identify one or more production parameters to apply in the working environment, the tool, or both. For example, the simulation may identify improvement or updates for the production parameters different from the default parameters. The method may further include executing the manufacturing production task using the tool in the working environment based on the one or more production parameters identified in the digital twin. According to the present disclosure, therefore, the digital twin based manufacturing may improve or optimize production of parts based on thorough modeling analyses and timely feedback/update by monitoring actual physical production, thus effectively reducing attempts of trial-and-error.

At a high level, digital twins may be used in different phases of the overall product lifecycle management (PLM). An overall conceptual digital twin may include multiple digital twins of each phase or aspect. For example, a digital twin for a manufacturing system may be categorized by objectives, purposes, or phases, such as a modeling piece that models the manufacturing process, a synthesizing piece that incorporates data of the physical production into the digital twin, and a retention piece that retains data for future references. The phases may include a conception or design phase, such as a PDT that supports research and development of (a) a product lifecycle of part designs, (b) manufacturing process improvements (e.g., in liquid metal jetting, or LMJ, systems, or for increased motion degrees-of-freedom), and (c) the mechanical behavior of parts manufactured in new materials.

The phases may also include a realization or manufacturing phase, such as a high-fidelity PDT that helps to define the manufacturing process envelop, supporting in-situ notification and/or process modification. In some cases, the data collect in-situ is fed back into the PDT, enhancing the understanding of the process and specifically the changes in downstream outcomes arising from variances in the process. The phases may also include a realization and/or testing phase, such as a PDT that provides an overall framework from which to improve the manufacturing process. As such, the PDT may produce benefits including lower failure rates, overall quality improvement, task-time and/or cost reduction and accelerated time-to-market of new part designs. In some cases, a PDT helps develop better understanding of the process quality window: fewer parts may be tested to qualify materials, designs and processes and fewer iterations are required to achieve part quality rates.

In maintenance or usage phases, an IDT may provide a way to estimate part properties that may affect choices of use. For example, a part with a higher expectation value of time-to-failure may be chosen for use in a less accessible location while one expected to fail earlier is installed in a easier to reach location. For modern 3D printing (3DP) processes (or other additive manufacturing processes) and parts, using digital twins according to the present disclosure may be advantageous in multiple ways.

First, process and part qualification may be monitored and predicted, thus reducing the number of trial-and-error cycles with physical 3DP to achieve reliable high-quality parts. In some cases, part quality may refer to shape (e.g., geometric/dimensional accuracy, surface roughness, and porosity) or material properties including mechanical (e.g., yield strength, ultimate strength, and elongation), thermal, etc.

Second, the control and design for quality may be timely adjusted. To adjust process parameters and/or part designs, in a process and machine-state aware manner, to achieve improved, desired, or optimized quality. As such, "first-time quality" (no parts thrown away) may be achieved.

Finally, the present disclosure supports novel additive or hybrid manufacturing techniques, such as new metal jetting 3DP systems, materials, and motion degrees-of-freedom. For example, the digital twin provides an environment for modeling improvement and allows the physical system to match what is needed for the modeled processes in the digital twin.

For example, the modeling piece of the system may be referred to as the PDT, which includes a composition of functions operating on one or more evolving virtual representations of states (e.g., machine state and part state, the latter may be referred to as part digital twin). The functions include various maps describing system input and output relationships, the interface with each other (e.g., input-output), the digital state representations, and the physical machine/environment through the inputs and outputs, which may be sensor/actuator signals, control signals, geometric and material properties, and other variables. In some cases, a parameterized digital twin of the manufacturing system may use fixed or default parameters (e.g., CAD models of machine components or constant operating parameters) as inputs to the different functions.

The present disclosure uses the term digital twin to generally refer to modeling of physical components in a synchronized manner. That is, when a new physical component (e.g., a sensor) is introduced in the manufacturing system, a digital counterpart may also be introduced, and vice versa. This aspect distinguishes the use of digital twin from a common computational simulation, which is disconnected from the physical world and standalone, while the use of digital twin relies on the mirroring between the virtual and physical worlds where a change/update in either could cause a corresponding change in the other. As discussed above, in a non-limiting example, a system level digital twin may include multiple subsystem digital twins, such as the PDT, LDT, and IDT. In some cases, the PDT would seem to be a subsystem of the overall LDT system, however, the PDT is considered as its own system in the present disclosure.

The IDT (e.g., a manufactured part) may include virtual (e.g., a digitized copy of the actual produced part), physical (the produced part), and hybrid (linking the virtual with the physical versions) versions. An IDT is a specific instance of a part manufactured by a process that is represented by a PDT. An IDT may be used within the LDT to track or keep records of how inputs such as designs and process parameters actually influence downstream outcomes such as time-to-failure and long-term cost-of-ownership. An IDT may be generated in various ways, such as by a virtual process, i.e., a PDT; from data collected from a physical, as opposed to virtual, process; or an arbitrary hybrid, or combination of the two. In some cases, pairs of virtual/physical or virtual/hybrid IDTs are important (thus represented using digital twins). Tracking the lifecycle performance of a physical, or hybrid, IDT enables improvements of the fidelity of the simulation, sensing, characterization, and correction functions, according to aspects of the present disclosure.

FIG. 1 illustrates a block diagram of a manufacturing system 100 of a physical manufacturing system 110 and its digital twin 120, in accordance with certain aspects of the present disclosure. As shown, the digital twin 120 includes digital twin representations 130, which represents the physical manufacturing system 110 by modeling digital representations corresponding to the physical components of the physical manufacturing system 110. For example, the physical manufacturing system 110 includes a working environment 112, which may provide a building platform, ambient temperature control, power supplies, etc. The physical manufacturing system 110 further includes one or more manufacturing materials 114, one or more production tools 116, and one or more sensors 118.

The physical manufacturing system 110 may use additive manufacturing (e.g., the production tools include a material deposition nozzle), subtractive manufacturing (e.g., the production tools include a cutter or grinder for material removal), or a combination thereof. The physical manufacturing system 110 may include one or more production parameters 119 to be used in the working environment 112, to control matter states of the manufacturing material 114, to control the production tools 116, and to configure the one or more sensors 118.

The digital representations 130 include corresponding digital representations for the working environment 112, the manufacturing material 114, the one or more sensors 118, and the production parameters 119. That is, a virtual working environment 132 models the working environment 112. A virtual manufacturing material 134 represents the manufacturing material 114. Virtual production tools 136 represent the production tools 116. Virtual sensors 138 represent the one or more sensors 118. The virtual components 132-138 in the digital twin representations 130 may be generated based on the physical counterparts 112-119 in the physical manufacturing system 110; or the physical counterparts may be made or realized according to the virtual components 132-138. For example, one or more components in the physical manufacturing system 110, such as the manufacturing material 114 or production tools 116, may be replaced with one that matches an updated representation in the digital twin 130.

The manufacturing system digital twin 130 includes a production simulation processor 140, which may perform one or more simulations 144 of a production task 142. The production task 142 may include a digital model of a part to be manufactured and associated requirements (e.g., tolerance, strength properties, etc.). In some cases, the production task 142 includes a default set of production parameters 146, which may be updated during simulation verification.

For example, the production simulation processor 140 computes the simulation 144 based on the default set of production parameters 146 and determines behavior prediction 148 that indicates errors, defects, or potential failures during production. The errors may include geometry or dimension variations due to temperature control, material deposition, or tool path choices. The defects may include local overheating or underheating (e.g., causing structural defects in LMJ 3D printing), overhang errors due to lack of support, or over/under depositions that alter functional aspects of a geometry (e.g., blocking holes due to over-deposition or causing loose fitting due to under-deposition). Potential failures may include tool failures (e.g., wear, clogging, deformation, etc.), environment failures (e.g., overheating or insufficient operation temperature), and other production failure modes (e.g., tool breakage due to fatigue).

Based on an iteration of the behavior prediction 148, the production simulation processor 140 may update the production parameters 146 to an updated set in view of the errors, defects, or production failures, if any. The production simulation processor 140 may then re-run the simulation 144 using the updated set of production parameters 146 and evaluate consequent changes to the errors, defects, or production failures. In some cases, the updated set of production parameters 146 may be constrained by configuration or settings availability of the physical manufacturing system 110. For example, the working environment 112 may be constrained by temperature ranges unless a different heating element or insulation configuration is implemented by replacing the existing ones. The production tools 116 may be limited by a range of movement speeds or loading capacity. In some cases, the updated set of production parameters 146 may be open to changes not limited by the configuration or settings available at the physical manufacturing system 110, expecting physical updates in the physical manufacturing system 110 to match the requirements of the digital twin 130 when improved simulation 144 is achieved.

Figure 2:
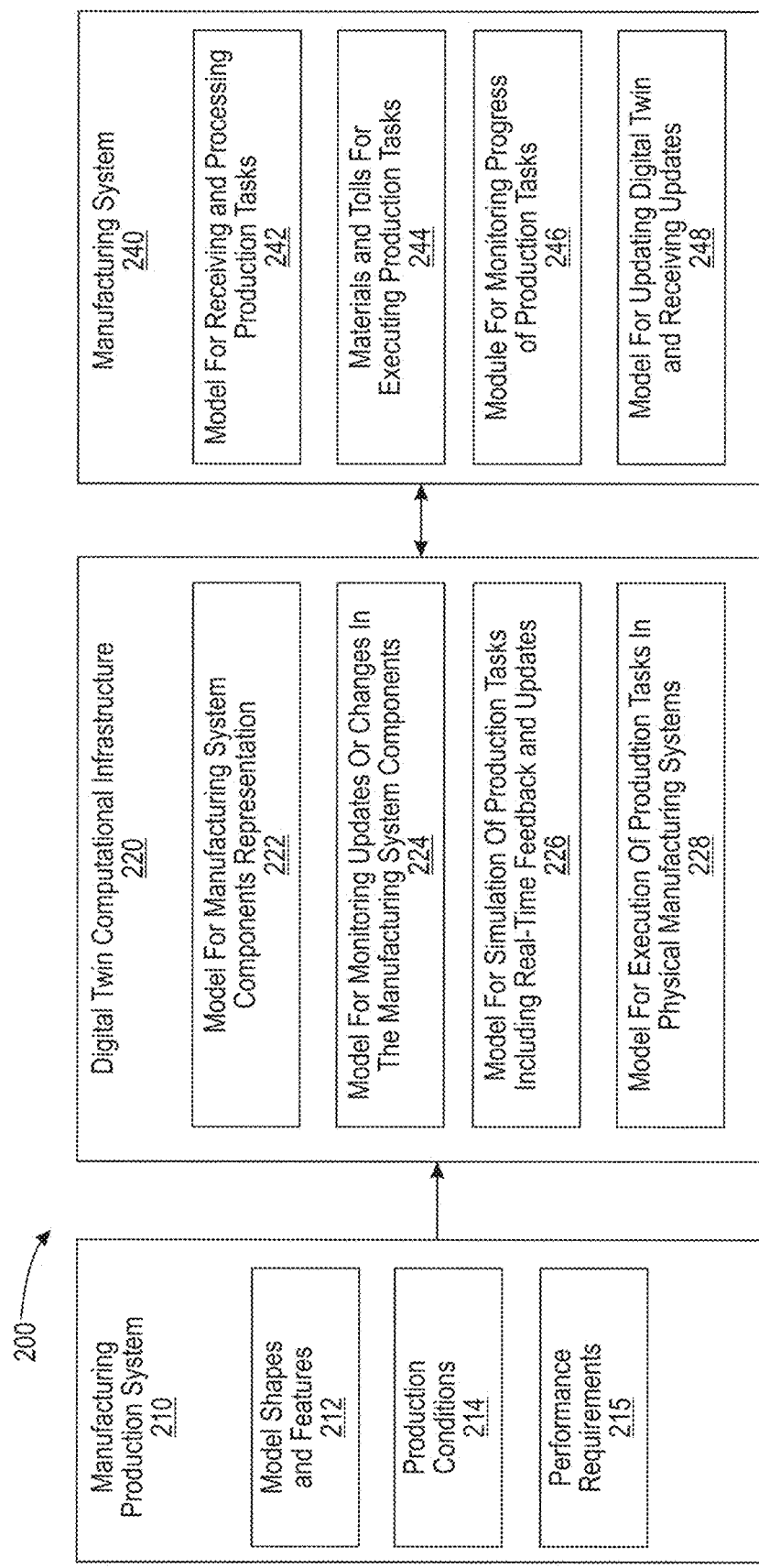
FIG. 2 illustrates a block diagram of data flow/feedback in part manufacturing using a digital twin computational infrastructure, in accordance with certain aspects of the present disclosure.

FIG. 2 illustrates a block diagram 200 of data flow/feedback in part manufacturing using a digital twin computational infrastructure, in accordance with certain aspects of the present disclosure. As shown, the block diagram 200 starts with a manufacturing production task 210, which may be received or generated (e.g., based on certain user input, such as initial drawings or geometry requirements) at the manufacturing system 105 of FIG. 1. The manufacturing production task 210 includes at least one or more model shapes and features 212, one or more production conditions 214, and one or more performance requirements 216. The manufacturing production task 210 is provided to the digital twin computational infrastructure 220, such as via a network connection.

The digital twin computational infrastructure 220 may include a network of computational resources for realizing various functions in respective modules. For example, the digital twin computational infrastructure 220 includes a module for manufacturing system components representation 222, which generates or maintains a digital twin counterpart for each significant physical components in the manufacturing system 240 (e.g., components that impact the manufacturing process or part lifecycle).

The digital twin computational infrastructure 220 includes a module 224 for monitoring updates or changes in the manufacturing system components in order to update the digital twin representations in synchronization with physical changes in the manufacturing system 240. The digital twin computational infrastructure 220 includes a module 226 for simulation of production tasks including real-time feedback and updates. The module 226 may perform simulation of the manufacturing production task 210.

The module 226 may receive measurement information from various sensors and/or changes of components in the manufacturing system 240. The digital twin computational infrastructure 220 includes a module 228 for execution of production tasks in physical manufacturing systems, which communicates with the manufacturing system 240 to provide instructions and production parameters for executing the manufacturing production task 210.

The manufacturing system 240 is coupled with the digital twin computational infrastructure 220 such that at least the digital representations of the components of the manufacturing system 240 are updated to reflect changes in the manufacturing system 240. In some cases, the manufacturing system 240 may update production parameters, configurations, or settings to match those in the digital twin computational infrastructure 220. As shown, the manufacturing system 240 includes the module 242 for receiving and processing production tasks, such as the manufacturing production task 210. The manufacturing system 240 includes materials and tools 244 for executing the production tasks, such as by additive manufacturing, subtractive manufacturing, or both.

The manufacturing system 240 includes the module 246 for monitoring the progress of production tasks. For example, the module 246 may include various sensors, such as cameras, thermometers, pyrometers, position sensors, to monitor the production progress. The manufacturing system 240 includes module 248 for updating the digital twin of the manufacturing system 240 and receiving updates. For example, the module 248 communicates with the module 226 for synchronizing the digital twin computational infrastructure 220 and the manufacturing system 240.

In some cases, the digital twin computational infrastructure 220 represents a digital twin, such a lifecycle digital twin (LDT), which includes a database cluster, computational infrastructure, and multiple micro-services. The micro-services may provide the required functionality, such as: storage and retrieval of current, or previous model parameters, retrieval of final and intermediate results and sensitivities from process digital twin (PDT) functions from input parameters. The micro-services may include incorporation and retrieval of lifecycle data such as mechanical testing results, system/sub-system health metrics. The micro-services may include creation of surrogate models of any functional piece of the PDT. The micro-services may provide functional pieces of the PDT the ability to register model parameters (as opposed to inputs) such that those parameters are subsequently and perpetually tuned to better reflect physical (as opposed to virtual) results.

The micro-services may generate and retain, keyed by input, of, potentially time-dependent, health metrics and engineered features thereof from aspects of PDT and/or lifecycle data. The micro-services may provide input tuning via PDT modeling functionality, which includes an input tuning function provided as a service. The input tuning function may provide a loss function (e.g., of the available PDT function outputs) as a service. The input tuning function may be inserted into a PDT, or register its modeling parameters with the system.

The input tuning function may subscribe to the outputs and sensitives of PDT functions. The input tuning function may publish to the inputs, to provide corrections, of PDT function. The input tuning function (and its parameters) may be tuned by the system by having the system run the PDT with the input tuning function, attempting to minimize the value of the registered loss function over an envelope of input parameters.

The micro-services may include a parameter tuning of PDT modeling functionality, which includes a PDT modeling function. The PDT modeling function is provided as a service. The PDT modeling function may provide a loss function (of all available PDT function outputs) as a service. The PDT modeling function may be inserted into a PDT. The PDT modeling function may register its modeling parameters with the system. The PDT modeling function may subscribe to the outputs and sensitives of PDT functions. The PDT modeling function may publish to the inputs, to provide corrections, of PDT function. The PDT modeling function (and its parameters) may be tuned by the system by having the system run the PDT with the candidate function, attempting to minimize the value of the registered loss function over an envelope of input parameters.

The micro-services may include representation and parameter tuning of arbitrary sense-and-correct functionality, such as a candidate sense-and-correct service. The candidate sense-and-correct service is inserted into a PDT. The candidate sense-and-correct service may register its modeling parameters with the system. The candidate sense-and-correct service may subscribe to the outputs of PDT functions. The candidate sense-and-correct service may publish to the inputs, to provide corrections, of PDT function. The candidate sense-and-correct service (and its parameters) may be tuned by the system by having the system run the PDT with the candidate controller over an envelope of input parameters.

Figure 3A:
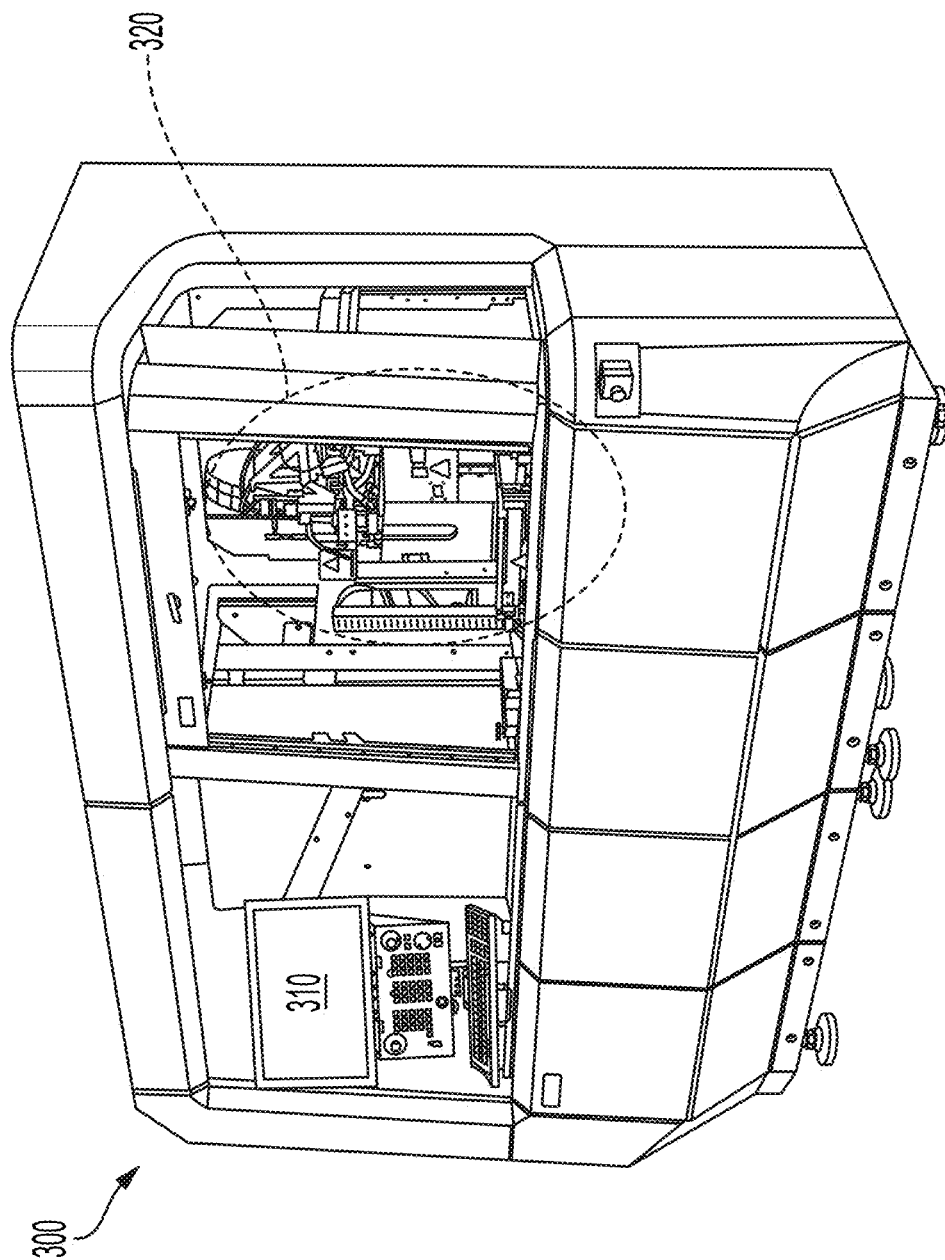
FIG. 3A illustrates an example of a physical manufacturing system and FIG. 3B illustrates a visual representation of components thereof, in accordance with certain aspects of the present disclosure.
Figure 3B:
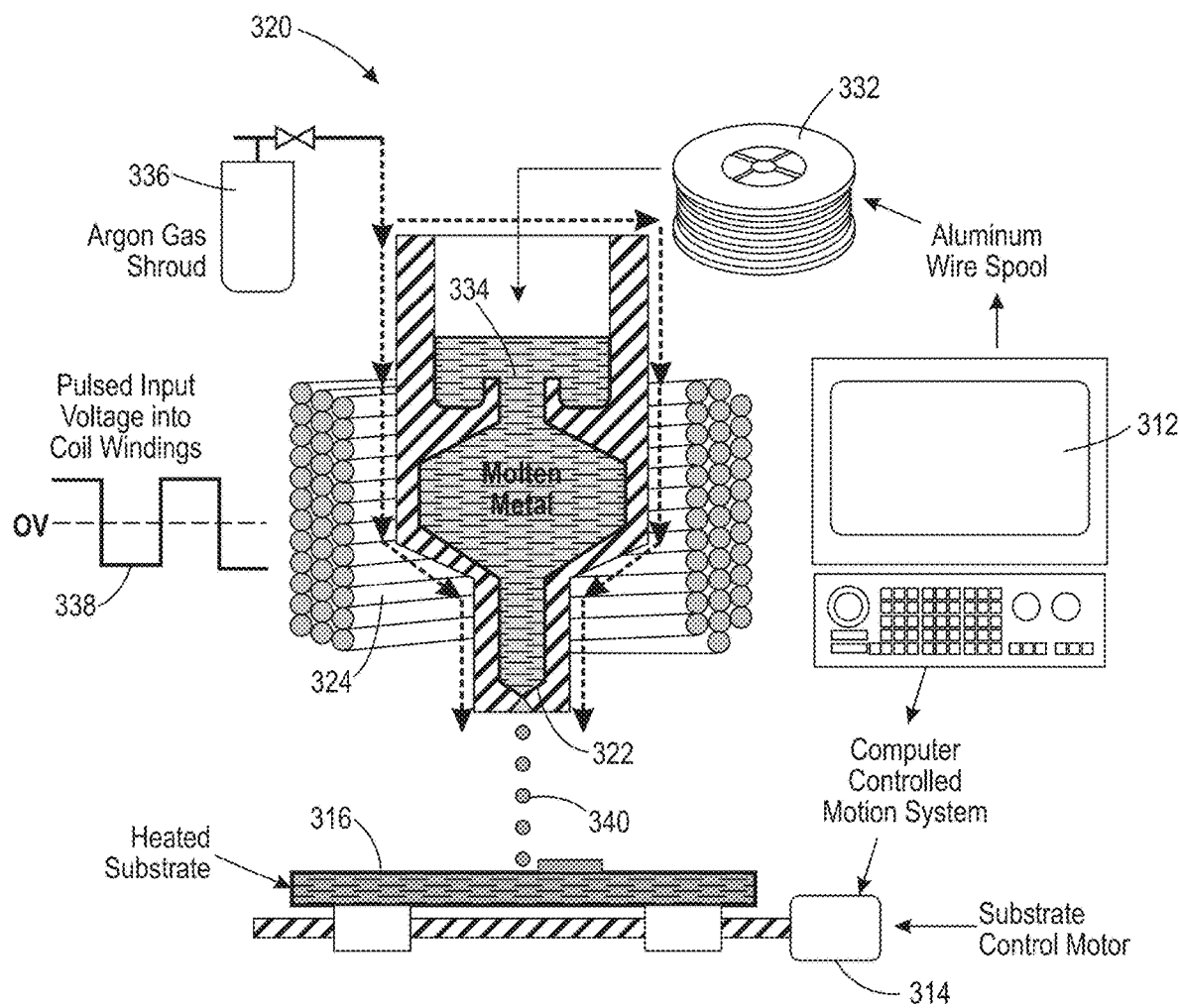

FIGS. 3A and 3B illustrate an example of a physical manufacturing system 300 and a visual representation 320 of components thereof, in accordance with certain aspects of the present disclosure. The visual representation 320 shown in FIG. 3B represents digital twins of some major components in the production chamber of the system 300. As shown in FIG. 3A, the manufacturing system 300 includes a user interface 310 and a manufacturing environment represented by the visual representation 320, which represents a process digital twin (PDT). The PDT and the mirrored manufacturing system 300 include a composition of functions operating on one or more evolving virtual representations of state (e.g., machine state and part state, the latter being the same as part the digital twin).

The functions, which maps outputs from inputs, may interface with each other, e.g., interfacing the digital state representations and the physical machine/environment through the inputs and outputs. The inputs and outputs may include sensor/actuator signals, control signals, geometric and material properties, among other variables. In some cases, a parameterized digital twin, such as one that uses fixed parameters (e.g., CAD models of machine components or constant operating parameters), may also be provided as inputs to different functions.

As shown in FIG. 3B, the visual representation 320 includes a parameterized PDT for drop-on-demand (DoD) liquid metal jetting (LMJ) 3D printer (3DP). According to aspects of the present disclosure, methods and systems of developing a PDT for a 3DP that uses a magnetohydrodynamic (MHD) pumping process in conjunction with a numerical control system (e.g., Siemens Sinumerik). For example, in LMJ of the visual representation 320, a metal spool 332 (e.g., aluminum) is heated into a molten state 334 to be deposited on a build platform 316 (e.g., a heated substrate) via a nozzle 322.

The nozzle 322 is protected by an inert gas shroud (e.g., argon) 336 and is heated by a coil winding 324 that receives electric power 338. The nozzle 322 may control the rate of deposition 340 by adjusting the pressure differentials (e.g., by changing the air and liquid pressures inside and outside the nozzle 322). The build platform 316 is actuated by a control motor 314 (or one or more such motors in multiple axes). For example, the control motor 314 may move the build platform 316 in an axis at various rates, as controlled by the computational system 312. The computational system 312 may be a component of the PDT (e.g., an interface for receiving instructions from processors of the PDT or providing feedback or measurement data to the processors of the PDT).

The computational system 312 may operate to control the temperature of the nozzle 322, such as by controlling the coil windings electrical power, which generates a varying magnetic field that produces electricity in the nozzle 322, turning into heat. The computational system 312 may also control the nozzle temperature by altering the feed rate of the metal spool, as latent heat is absorbed when the spool material 332 is changed from the solid state into the liquid state. The computational system 312 may further control the rate of deposition 340, the movement speeds of the nozzle 322, and the temperature and movement speeds of the build platform 316, among other production related behaviors.

Figure 4:
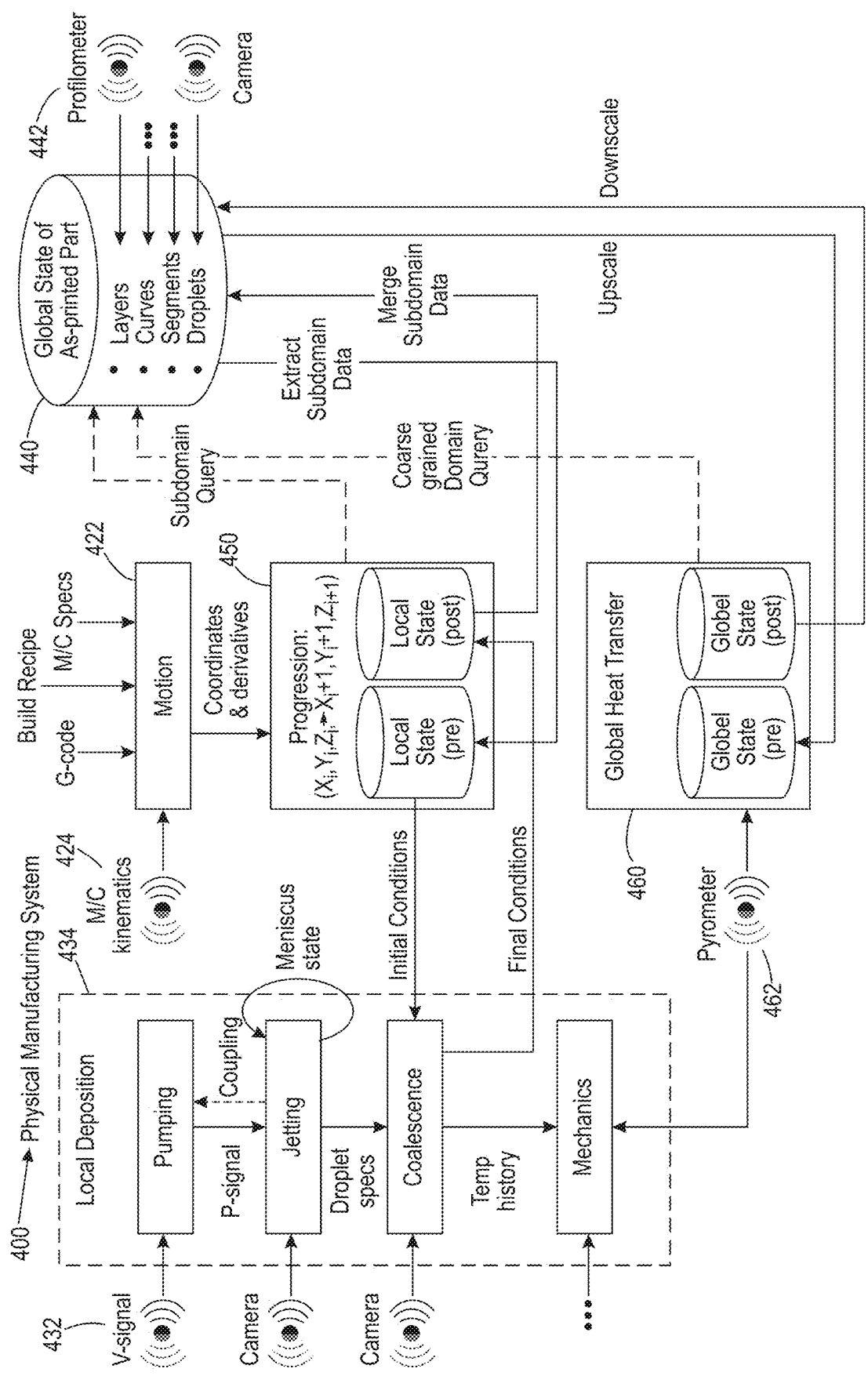
FIG. 4 illustrates a block diagram of data flow in a physical manufacturing system, in accordance with certain aspects of the present disclosure.

FIG. 4 illustrates a block diagram of data flow in a physical manufacturing system 400, in accordance with certain aspects of the present disclosure. As shown in FIG. 4, the physical manufacturing system 400 may be represented in different physical states, including the local deposition 434, the motion state 422, the progression state 450, and the global heat transfer state 460. The physical manufacturing system 400 may include various sensors 424, 432, 442, and 462 for measuring the various states. The sensor measurements may help the physical manufacturing system 400 monitor and determine whether the production process is proceeding as planned as well as provide feedback to the digital twin (shown in FIG. 5) for computing and/or updating applicable production parameters.

For example, the local deposition 434 may include states of pumping to provide pressures to the deposition nozzle, states of jetting the molten material, states of coalescence of the deposited materials, and states of the mechanics of the solidified materials. The sensors 432 may monitor a voltage signal for the pumping operation, a camera (e.g., for computer vision) to monitor the jetting operation, and another camera to monitor the coalescence operation. For example, the cameras may include the nozzle and the deposited materials in the respective fields of views to capture videos for computer vision analyses. Similarly, the motion state 422 of the nozzle may be monitored by sensors or cameras 424 that measures the motion of the nozzle. The coordinates and derivatives of the data collected by the sensors 424 may be used to determine the progression state 450 (e.g., a percentage of the overall operation). The global state 440 of the as-printed part includes high level characterization of layers, curves, segments, and droplets, in addition to the local characterization at the local deposition states 434. The global state 440 may be monitored using a profilometer, and/or cameras as the sensors 442. The global heat transfer state 460 may be monitored by a pyrometer 462.

Figure 5:
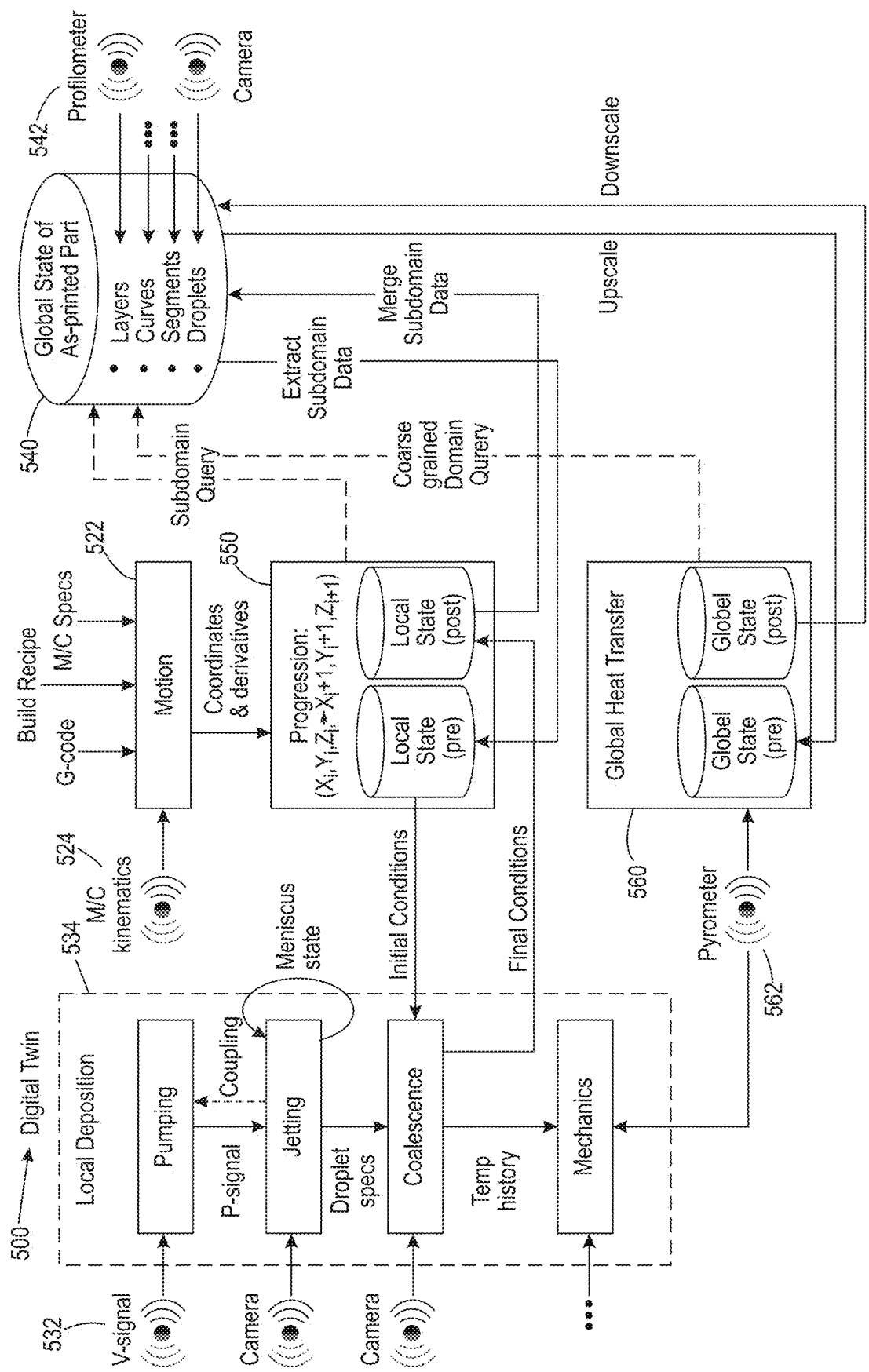
FIG. 5 illustrates an example of data flow in a digital twin of the physical manufacturing system of FIG. 4, in accordance with certain aspects of the present disclosure.

FIG. 5 illustrates an example of data flow in a digital twin 500 of the physical manufacturing system 400 of FIG. 4, in accordance with certain aspects of the present disclosure. As shown, each physical aspects (e.g., states) of the physical manufacturing system 400 has a corresponding digital or virtual representation in the digital twin 500. That is, the digital twin provides models or simulations for the local deposition states 534, the motion state 522, the progression state 550, the global state 540 of as-printed part, and the global heat transfer state 560.

Corresponding to the various physical sensors in the physical manufacturing system 400, the digital twin 500 also includes sensors 532 for monitoring (e.g., monitoring simulation values thereof) the local deposition state 534. Likewise, the digital twin 500 includes sensors 524 for monitoring the motion state 522, sensors 542 for monitoring the global state 540 of the as-printed part, and sensor(s) 562 for monitoring the global heat transfer state 560. That is, the digital twin 500 may completely model each component or characterization thereof in the physical manufacturing system 400.

Referring to both FIGS. 4 and 5, the digital twin 500 and its physical counterpart 400 may include the machine (including the build platform, additive or subtractive tools, etc.), the part (or the manufacturing materials for producing the part), and the environment. The state variables may be abstracted by a collection of temporal, spatial, or spatiotemporal signals or fields, properties of which are typically either measurable (partially or completely) on the machine or predictable from other quantities via model-based, data-driven, or hybrid simulations.

The state variables may be represented approximately on a computer either explicitly by enumeration in space and/or time (e.g., discrete values sampled along time and/or over a Cartesian grid or other (un)structured mesh in 3D space) or implicitly by parameterizing the functions (e.g., a neural network approximator). Note that geometry may also be described as a field (by means of a level set).

For example, the machine state may be a collection of (actual and/or simulated) multi-modal sensory data such as time series data from the sensors 432/532, 424/524, 442/542, and 462/562, such as optical sensors (e.g., cameras), thermometers, pyrometers, motion sensors (e.g., accelerometers, inertia measurement units, gyroscopes), etc. It may also include 2D images, 3D models reconstructed from images, video/audio data, etc.

The part state may be an evolving 3D geometric and physical representation (e.g., a voxelized representation of shape/phase, temperature, pressure, velocity, and material fields) of the as-printed part. The environmental state may be a recording of ambient temperature, humidity, platform motion (e.g., if the 3D printer is mounted on a moving vehicle/vessel). For each of these states, one may use a global (i.e., master) representation. Optionally, one or more local representations may be used to do local computation/reasoning, which would synchronize with the global representation with some regularity.

For example, the global representation of the evolving part may entail a time-varying spatial field representation of the relevant geometric/physical/material properties. Consider a spatial enumeration such as values sampled over a 3D Cartesian grid node (or volume-integrated over voxels). Each node/voxel may have a phase ratio (for solid, liquid, or gas fraction), a temperature value (scalar), a velocity value for the fluids (vector), an elasticity value for solids (tensor), and so on. Note that other discretization schemes such as linear combinations of finite element/volume or spectral basis functions or nonlinear regressors such as neural networks may be used.

A subset of the global representation that is immediately under the print-head (from which hot metal droplets are being jetted) may be isolated to simulate droplet coalescence. For example, the global representation may be at a resolution of $O(10^3)$ per Cartesian axis while the local subdomain is at a resolution of $O(10^2)$ per Cartesian axis. The properties included in the local representation may or may not be exactly the same as the global ones, but they may be overlapping or related (e.g., by integration or averaging/coarse-graining).

Several functions may be used to represent state transitions (communicating with global and/or local representations) or stateless computations (mapping inputs to outputs without side-effects), modeling the physical 3DP process. For example, the functions may include a motion function, a derived motion function, an in-situ process correction function, a progression function, a pre-heating function, a local deposition function, a global multi-physics function, a mechanical properties function, among others.

For example, the motion function may map, at least, G-code, build recipes, and numerical controller parameters to a set of coordinates and potentially time derivatives (e.g., velocities, accelerations, and jerks) prescribing relative motion between the print-head and build-plate. The derived motion function may compute or simulate the vibrations of the machine induced by the motion of the build plate. This maps the motion of the build plate to relative motion of the pump head with respect to nominal instantaneous pump-head build-plate frame of reference. In some cases, this relative motion may be used to either modify the output of the motion function or to as an input parameter to other functions as part of a model of uncertainty.

The in-situ process correction function may model different ways in which the machine (or the manufacturing system 400) changes its instruction set (e.g., production parameters), the nominal g-code for example, based on its understanding of the current state of the machine. For example, the machine may, before printing starts and while printing, modify the overall g-code to, for example, change the location and order of the prescribed drops to improve outcomes. These machine-side changes may be modeled for an accurate PDT.

The progression function may include two primary subfunctions: a read subfunction and a write subfunction. For example, the read subfunction may extract a local subdomain from the global representation of part fields (e.g., shape/phase, temperature, and porosity). The subdomain location is a function of the coordinates provided by the motion function. The fields restricted to the subdomain specify initial and/or boundary conditions for the local simulation. The write subfunction may merge the results of the simulation, restricted to the subdomain, back into the global representation. The pre-heating function may provide pre-heating for both global and local temperature controls.

The local deposition function may map physical process parameters to local shape and material specs of the part. For example, the physical process parameters may include parameters for the pumping (upper pump section) function. For a given fixed print-head (e.g., the nozzle 322) and liquid metal properties and/or specifications (e.g., pump/nozzle CAD models, coating, liquid conductivity and viscosity etc.), the pumping function may map the voltage signal, which is a function of the coordinates from the motion function above, such as represented in a voltage signal (v-signal) to a pressure signal (p-signal) at the liquid metal interface between upper and lower pump sections.

The jetting (lower pump section) function may map the pressure signal and alloy liquid state at the lower pump to the released droplet specs (size/shape, velocity, temperature) and meniscus motion (oscillation frequency and damping rate). The coalescence function may map the droplet specs and substrate specs (pre-coalescence) to the substrate spaces (post-coalescence).

The mechanical properties function may map pre-coalescence substrate specs (most importantly local shape and temperature history, as well as kinematics and pressure) to post-coalescence substrate specs, potentially including shape, microstructural specs, and bulk material properties. The global multi-physics function may map an X property to a different, Y, property.

The data acquisition function may map the global/local state to data artifacts as generated by the 3DP or the system 400. For example, the process for generating data representing the z-height of intermediate surfaces may be simulated. This data may serve several purposes. For example, the data may be input to process components or compared in-situ with actual data as a health metric.

In some cases, the environmental conditions (e.g., ambient temperature, humidity, oxygen, build-plate vibration, systematic plant movement, etc.) may be additional inputs to all of the above functions, such as where or when it is deemed important to predict or simulate the outputs accurately for a given context.

To accommodate the variability from one machine or manufacturing system to another, or from one build instance to another on the same machine or 3DP, the above representations and function inputs/outputs may be probabilistic, e.g., each variable may be perceived as a random variable with an associated uncertainty modeled by confidence intervals or probability distributions.

In the digital twin 500, model-based high-fidelity simulators (e.g., computational fluid dynamics (CFD) and solid mechanics solvers), purely data-driven or empirical surrogate/reduced-order simulators (e.g., physics-based nonlinear oscillators to reproduce jetting dynamics or liquid droplets that coalesce, machine learning (ML) based mapping of inputs to outputs, etc.), or a combination of the two (e.g., physics-informed ML or data-calibrated CFD) may be used.

Such models may be generated or developed by first identifying a set of symbolic ordinary differential equations (ODE) or partial differential equations (PDEs) and initial/boundary conditions (ICs/BCs), discretizing and numerically implementing them in a computational platform, generating simulation data, comparing simulation data (or certain properties derived from it) with experimental measurements, and calibrating the free parameters (e.g., phenomenological coefficients and material properties). The process may require many iterations in which new insight is gained, leading to updating the symbolic models, as shown in FIG. 6 and discussed below.

Figure 6:
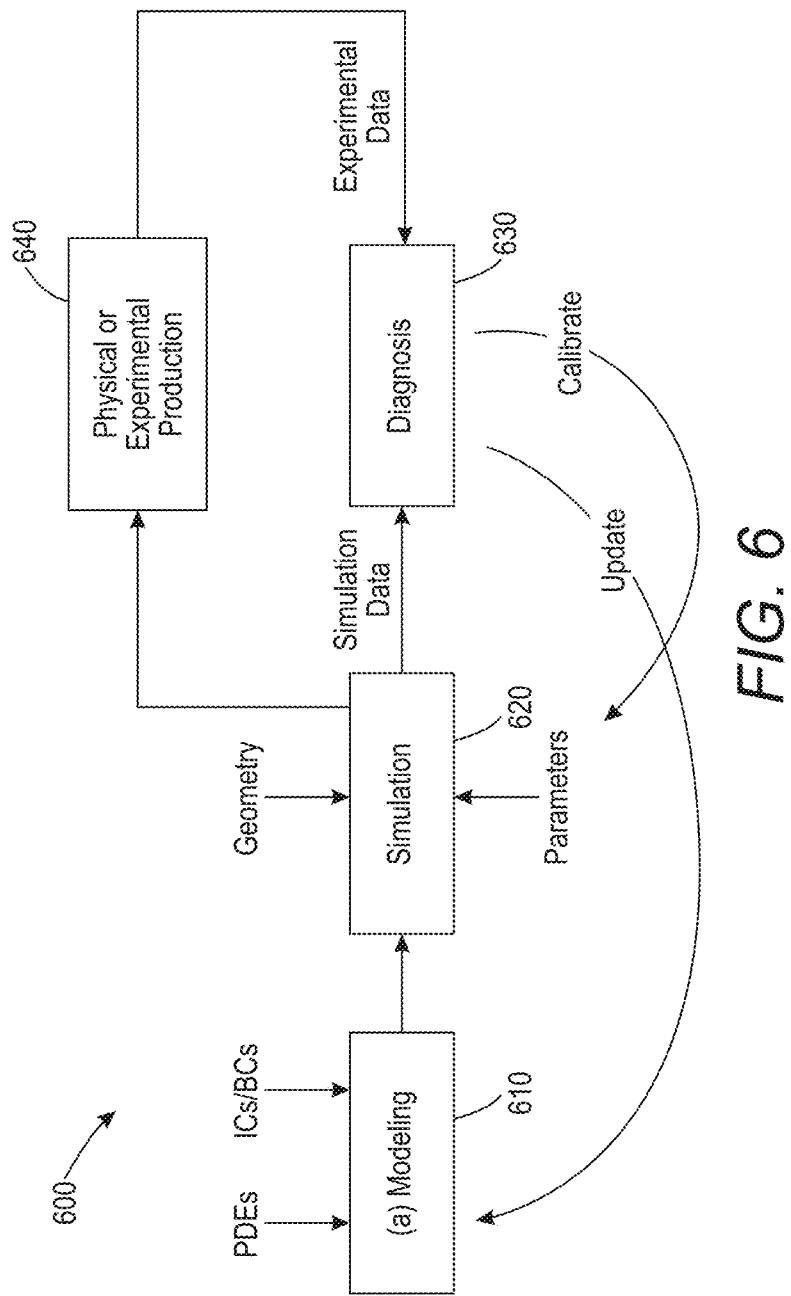
FIG. 6 illustrates an example of updating the digital twin of FIG. 5 in view of production data, in accordance with certain aspects of the present disclosure.

FIG. 6 illustrates an example 600 of updating the digital twin 500 of FIG. 5 in view of production data, in accordance with certain aspects of the present disclosure. For example, the updating iterations may be based on machining learning (ML), which allows for simulation-based production parameters update with physical measurement feedback. For example the training/testing of ML and calibration of CFD models, among other offline and online data assimilation approaches, may address and consider the machine state or variability. Feedback or training data may be provided by various sensors instrumented on the machine and used to calibrate the models (offline training), update the models on-the-fly (online training), evaluate sources of uncertainty, etc.

As shown, the example 600 includes a modeling block 610, a simulation block 620, a diagnosis block 630, and a physical or experimental production block 640. The modeling block 610 may include partial differential equations (PDEs), initial conditions (ICs), and boundary conditions (BCs) for each production task. The digital twin (such as the digital twin 500) may receive the geometry of the parts to be manufactured and determine production parameters based on the PDEs, ICs, BCs, and the part geometry.

The simulated data may be sent to the diagnosis block 630 as well as physical production 640 (e.g., at the physical manufacturing system 400). Various sensor data (e.g., experimental data) describing the production process and the produced part are provided to the diagnosis block 630 to verify the simulation process at the simulation block 620. The verification may be used to calibrate the settings or configurations at the simulation block 620. Once calibrated, the comparisons between the simulation data and the experimental data may be used to update the PDEs, ICs, and BCs at the modeling block 610 (so that the production conditions may be more accurately described than prior to such updates).

In some cases, for each sensing modality, a data processing function (e.g., data analytics, diagnostics, and prognostics) may be used to convert the raw data into useful information to be assimilated into the other functions and representations. For example, high-speed camera data may undergo image processing to identify and segment droplets or meniscus profile and fit important properties such as droplet aspect ratio and meniscus frequency and damping rate to calibrate the CFD models, profilometry data may be registered to ground the surface roughness prediction errors, CT-scan data may be filtered (e.g., by a threshold value) or processed to obtain porosity, and so on.

The manufacturing system 400 and the digital twin 500 may employ multi-modal sensing and control, which may include a set of sensor components that monitor the printing process. The set of sensors may include thermal, visual and laser-based sensors (embedded or not) in the printer that upon deployment provide vital data in real-time of the status and health of the printer (examples shown in FIGS. 4 and 5). the digital twin may have an interface to accept the sensor data as feedback (e.g., real-time feedback, or optimization feedback for offline analyses or simulations) and incorporate the sensor data for specific production tasks, such as synergetic sensor calibration (e.g., high-speed camera and laser based sensor for jetting analytics), reduced order model validation, parametric tuning of the digital twin solvers, etc.

In some cases, another set of algorithmic blocks embedded in the digital twin, may include system identification, diagnostics, and control. For example, in a supervisory control scenario, sensor data analytics may reveal potential faults, errors, and/or disturbances in part of the system. the digital twin's embedded software may perform specified system identification or diagnostic routines to detect, isolate the fault/error, and then recommend or activate mitigation strategies (e.g., by increasing or slowing tool movement speeds to correct related errors) with specific actions. The mitigation strategies may therefore meet safety and other constraints, and incorporate the changes into the physical printing process to obtain coherent/desired jetting and continuous operation. Examples of mitigation strategies may include: automatic tracking of user-defined jetting specs, ramp-up/slow-down printing speed, adjust jetting frequency, control level of melt pool, temperature adjustment, etc. The digital twin may determine the mitigation strategies based on data processing and predictive analytics on trained models detailed in previous section above.

In some cases (in view of the examples in FIGS. 4-6), when a new part is to be produced, the manufacturing system may start with a global representation (e.g., in the digital twin with virtual representations of each component) of the part, from an empty set (nothing on the build-plate). Given the G-code for the part to be printed, produced by a slicer and path planner software, the motion function generates a sequence of motions (displacements and its time derivates, e.g., velocities and, if needed, accelerations/jerks) which may be parameterized as a discrete set of coordinates or simple curve segments and their time derivatives (assuming 3-axis translation DOF only for flat 3DP). For machines equipped with higher-axis CNC motion systems, the parameterization may be combinations of translations and rotations (e.g., matrices or quaternions) and their derivatives for high-axis motion systems such as tilting build-plates or rotating chucks. The motions may be associated with small deviations due to machine vibration, uncertainties, etc.

The motions are passed to a progression function that moves a virtual subdomain to select a local representation from the evolving global representation, which is initially empty. The local representation is passed to the local deposition function, composed of a sequence of sub-functions. The pumping (upper pump section) function takes in a stimulus (e.g., voltage signal), upper pump specs (e.g., chamber geometry and magnetic coil parameters), and material feed specs (base material, feed rate, etc.) and predicts a pressure signal at the interface with the lower pump section. The function may use a combination of physics-based modeling/simulation (e.g., CFD simulations to predict an interface stimulus for jetting (e.g., pressure signal generated on the melted material at a cross-section separating upper and lower pump regions) and data-driven regression (e.g., a neural network trained to predict the pressure signal from the voltage signal for fixed other specs). For example, using magnetohydrodynamic pumping, such as the Xerox ElemX®, the simulations entail coupled fluid flow, heat transfer, and electromagnetic induction. Other embodiments may be based on different pumping methods such as pneumatic pumping used by LLNL in a different DoD-LMJ printer.

The jetting (lower pump section) function takes in the interface stimulus (e.g., pressure signal), lower pump specs (e.g., nozzle geometry and coating material, environmental properties such as gas shroud), and other relevant input to predict two things: (a) the specs of the released droplets (e.g., size/shape, velocity, temperature, composition including oxide/oxygen mixture); and (b) the properties of the meniscus (liquid/gas interface at the tip of the nozzle) (e.g., vibration modes: profile, frequency, and damping among other possible parameterizations). The former may be fed into the next sub-function as initial conditions, while the latter is important to monitor jetting quality, e.g., timely stabilization leading to more consistent high-frequency jetting.

The coalescence function takes in the droplet specs as input, along with additional heat input (as may be delivered to the droplet and/or the substrate by, e.g., a laser beam or a coil) and relevant environmental properties as well as the pre-coalescence substrate state (e.g., shape/phase, temperature, etc.). The latter is parsed from the local representation of the moving subdomain, supplied by the progression function. The droplet specs are projected on the same representation (e.g., a sphere or other parameterization that may be turned into a voxelized field) and unified with the substrate fields to produce the initial condition for physics-based (e.g., CFD) simulation or surrogate (e.g., machine/operator learning) simulation. The results are the post-coalescence substrate, i.e., the solidified union of the new droplet and the input substrate and its various properties (e.g., shape/phase, temperature, etc.) The shape/phase information is passed back to the progression function to update the global representation in a consistent way, resulting in a drop-by-drop evolution of a part-scale build simulation. The temperature history may then be used to infer microstructure properties in the next sub-function, while it is also fed back to the progression function to couple with a global (e.g., coarse-grained) heat transfer simulation.

The material properties function of the digital twin may take the shape/phase, porosity, and temperature history and other pertinent local properties (such as oxygen concentration in the build chamber, additional heat input delivered by a continuous-wave or pulsed scanning laser beam, etc.) to predict microstructure (e.g., grain characteristics/statistics) and mechanical properties (e.g., tensile strength and elongation).

The progression function (e.g., 450 or 550) may communicate between the global representation (460/560) and the local representation(s) (434/534) to inject an accurate update to the as-built global part state, e.g., moving the subdomain (where droplet coalescence occurs) to extract a subset of the global fields as initial condition to the coalescence model and to merge the final condition back into the global fields.

The global multi-physics function (e.g., 540 and/or 560) may compute simulation of global effects. Most of the physics relevant to deposition (pumping, jetting, coalescence, and materials) may be simulated locally, by restricting the domain to a small subset of the workspace/substrate. These include predictions of meniscus state and droplet specs at the nozzle and the phase change (solidification) dynamics. This is helpful in practice as global simulation of such complex effects for a part made of millions of droplets would be impractical due to prohibitive computational cost. However, certain physics still requires global modeling, including heat transfer (conduction and convection).

The global multi-physics function may perform a coarse-grained simulation on the global representation of the evolving part, to capture effects such as the role of geometry, e.g., thin features restricting the heat conduction rate, embedded features restricting convection rate, or tall features leading to vertical thermal gradients, hence nonuniform mechanical properties as the droplet coalescence occurs farther from the heated build-plate. To account for such effects, the global multi-physics and local deposition functions co-simulate the physics at different length and/or time scales asynchronously and synchronize at regular intervals. Data exchange between them occurs through read/write from the global representation to create pre- and post-simulation internal copies of global and local fields and synchronize after simulation (e.g., via mutual exclusion/locking). The internal representation may be at different scales, e.g., the local copies for the deposition function are high-resolution but restricted to a small region while the global copies for the coarse-grained heat transfer are low-resolution upscaled/homogenized view of the larger region.

FIG. 7-10 illustrate flow diagrams of methods of operations by a manufacturing system, in accordance with certain aspects of the present disclosure. For example, the operations may correspond to the processes described with reference to the digital twin example in FIGS. 1-6. The operations may be performed by a processing device, such as the manufacturing system 100 as described with reference to FIG. 1.

Figure 7:
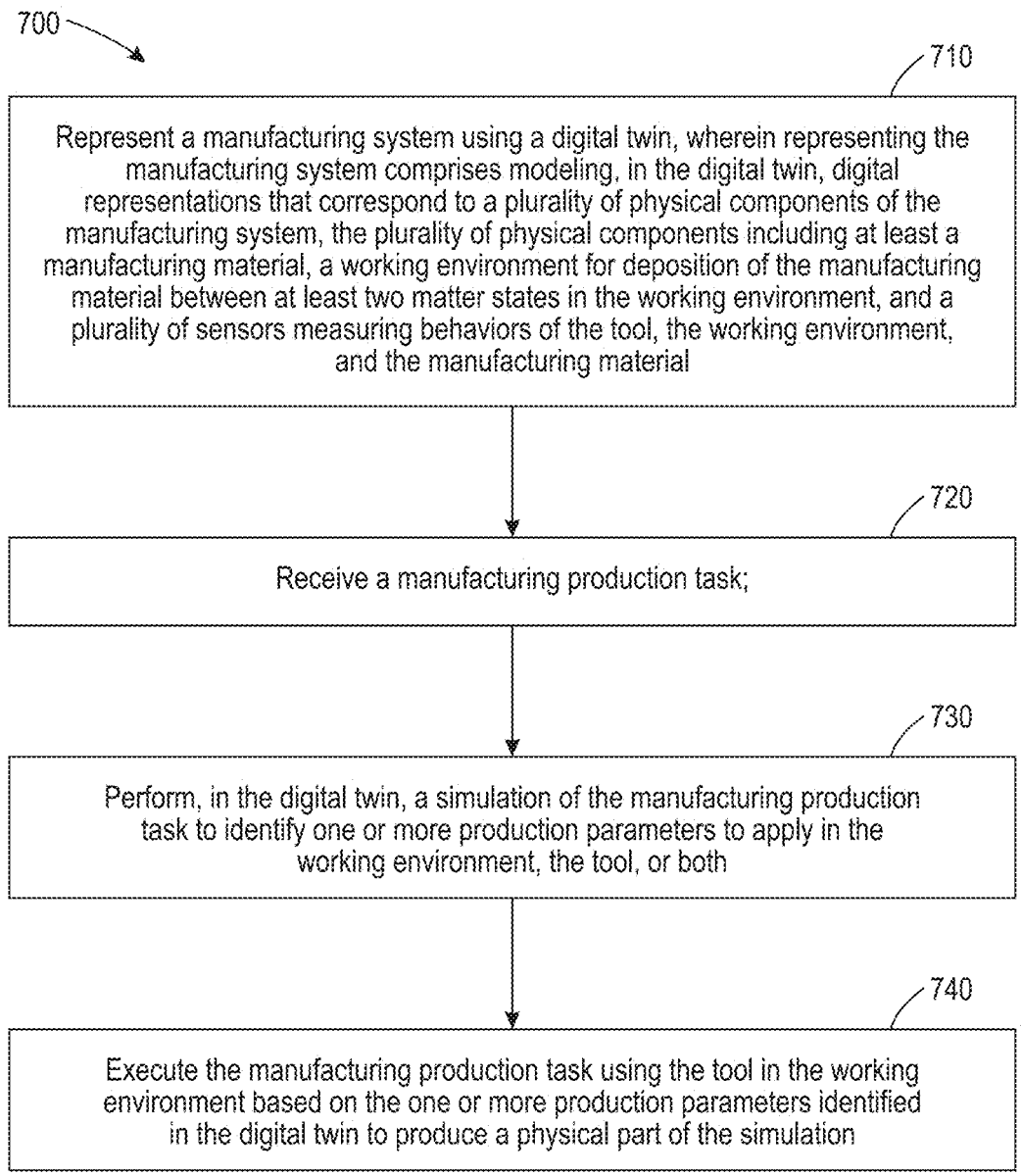
FIGS. 7-10 illustrate flow diagrams of methods of operations by a manufacturing system, in accordance with certain aspects of the present disclosure.

Turning first to FIG. 7, the operation 700 begins at 710 by representing a manufacturing system using a digital twin. Representing the manufacturing system using the digital twin may include modeling, in the digital twin, digital representations that correspond to multiple physical components of the manufacturing system. The multiple physical components may include at least: a manufacturing material, a working environment for deposition of the manufacturing material, a tool to manipulate the manufacturing material between at least two matter states in the working environment, and multiple sensors measuring behaviors of the tool, the working environment, and the manufacturing material.

At 720, a processing device of the digital twin may receive a manufacturing production task. In some cases, the production task may include the shape or geometry properties of a part to be manufactured, as well as related requirements such as tolerance, strength, and/or surface finish. For example, in FIG. 3A, the manufacturing system may receive a digital model of a part to be manufactured and configuration or production parameters for making the part using additive and/or subtractive manufacturing techniques.

At 730, the processing device performs, in the digital twin, a simulation of the manufacturing production task to identify one or more production parameters to apply in the working environment, the tool, or both. For example, because the digital twin represents the physical properties and behaviors of the manufacturing system, the simulation may be executed to identify potential risks and errors to be encountered physically, such as unexpected temperature localization (that may cause subpart mechanical properties in the part). The simulation may virtually At 740, the processing device executes the manufacturing production task (in the physical manufacturing system) using the tool in the working environment based on the one or more production parameters identified in the digital twin. In some cases, the production parameters identified in the digital twin may require hardware updates in the physical manufacturing system (e.g., changing one or more components) to satisfy the configuration or specification requirements in view of the production parameters.

In some cases, the tool may include at least one of: a deposition unit comprising a heating element and a deposition nozzle to melt and deposit the manufacturing material in the working environment, wherein the manufacturing material comprises a molten form of metal, glass, or thermoplastic; or a sintering unit comprising a layering mechanism and a laser to fuse a layer of the manufacturing material in the working environment, wherein the manufacturing material comprises a powder form of metal, glass, or thermoplastic.

Figure 8:
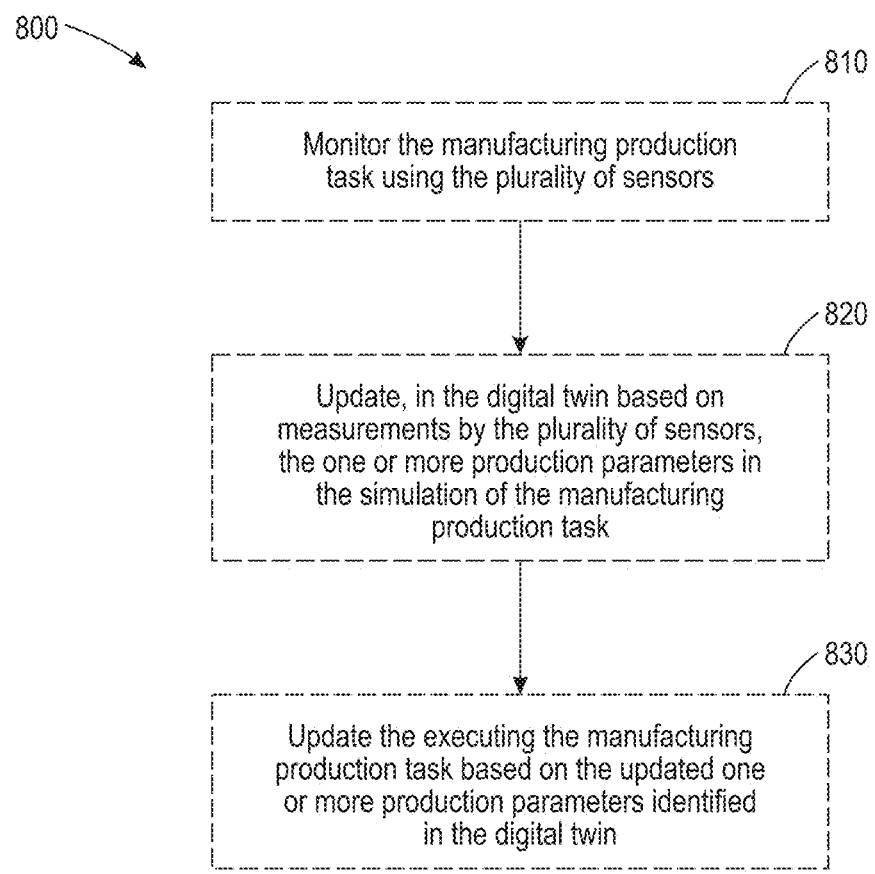

Turning now to FIG. 8, the processing device may monitor the physical production process and update the digital twin by performing one or more of the following operations 800. At 810, the processing device may monitor the manufacturing production task using the sensors in the physical manufacturing system. For example, cameras may capture dimensional information (including feature sizes and motions), pyrometers may measure temperature information, and motion sensors may provide feedback of tool movements, etc. The monitoring data may be compared against the simulation data stored in the digital twin.

At 820, the processing device may update in the digital twin, based on measurements by the various sensors, the one or more production parameters in the simulation of the manufacturing production task. For example, the updating of the production parameters may be ongoing (since the start of the production process) and near-real-time (e.g., instant or timely feedback for correcting errors in the current configurations).

At 830, the processing device may update the executing the manufacturing production task based on the updated one or more production parameters identified in the digital twin. Because the production process is timely corrected by the updated production parameters provided by the digital twin, the process differs from the sole simulation situations.

Figure 9:
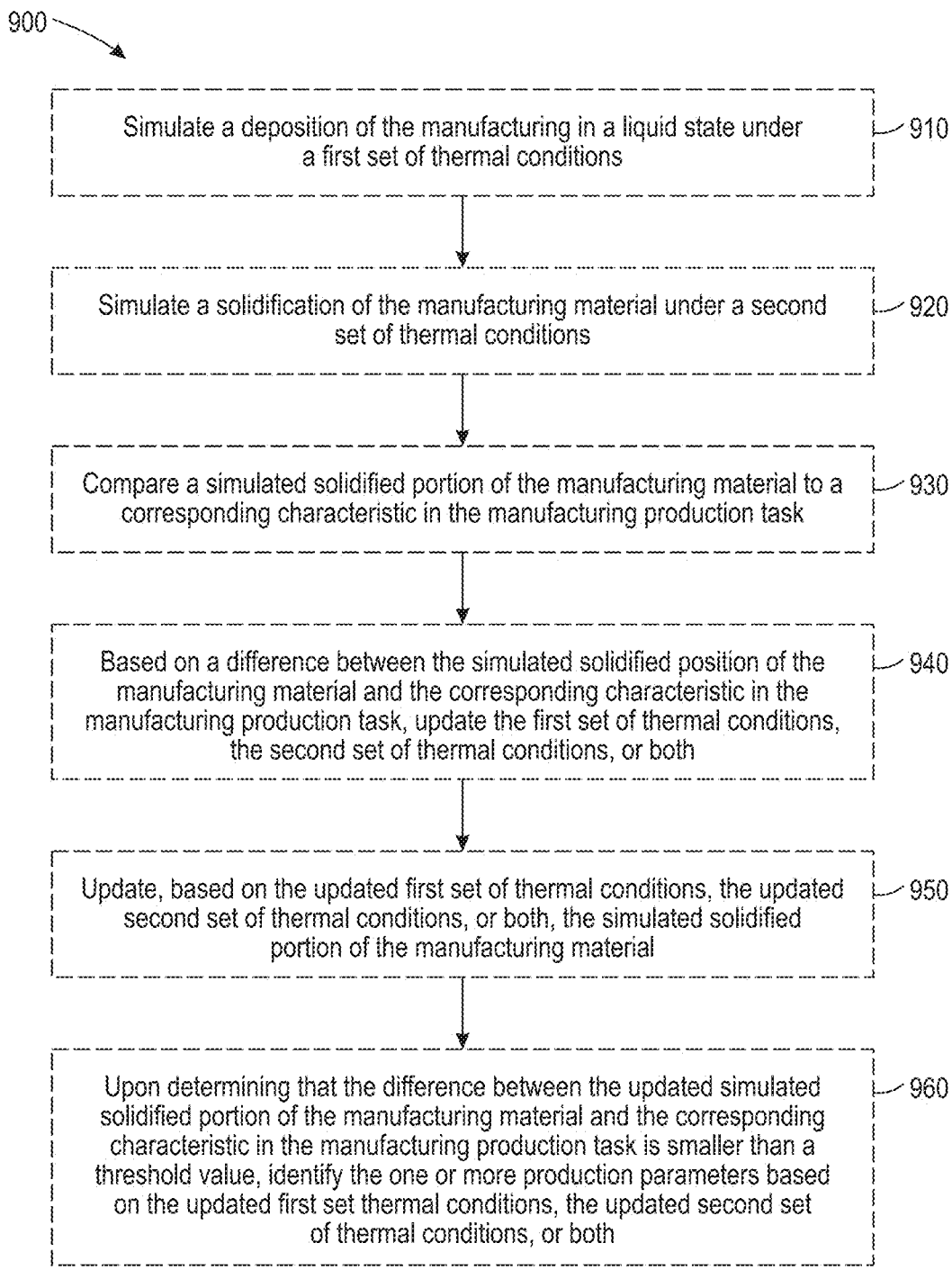

Turning now to FIG. 9, the processing device may simulate various aspects of the production process (e.g., the physical manufacturing process of the production task), as shown in the flow chart 900.

At 910, the processing device may simulate a deposition of the manufacturing material in a liquid state under a first set of thermal conditions.

At 920, the processing device may simulate a solidification of the manufacturing material under a second set of thermal conditions.

At 930, the processing device may compare a simulated solidified portion of the manufacturing material to a corresponding characteristic in the manufacturing production task.

At 940, the processing device may update, based on a difference between the simulated solidified portion of the manufacturing material and the corresponding characteristic in the manufacturing production task, the first set of thermal conditions, the second set of thermal conditions, or both.

At 950, the processing device may update, based on the updated first set of thermal conditions, the updated second set of thermal conditions, or both, the simulated solidified portion of the manufacturing material.

At 960, the processing device may identify, upon determining that the difference between the updated simulated solidified portion of the manufacturing material and the corresponding characteristic in the manufacturing production task is smaller than a threshold value, the one or more production parameters based on the updated first set of thermal conditions, the updated second set of thermal conditions, or both.

In some cases, the corresponding characteristic may include at least one of: a corresponding geometry; a corresponding porosity; a corresponding surface roughness; a corresponding fatigue property; a corresponding tensile strength property; or a corresponding stress level.

Figure 10:
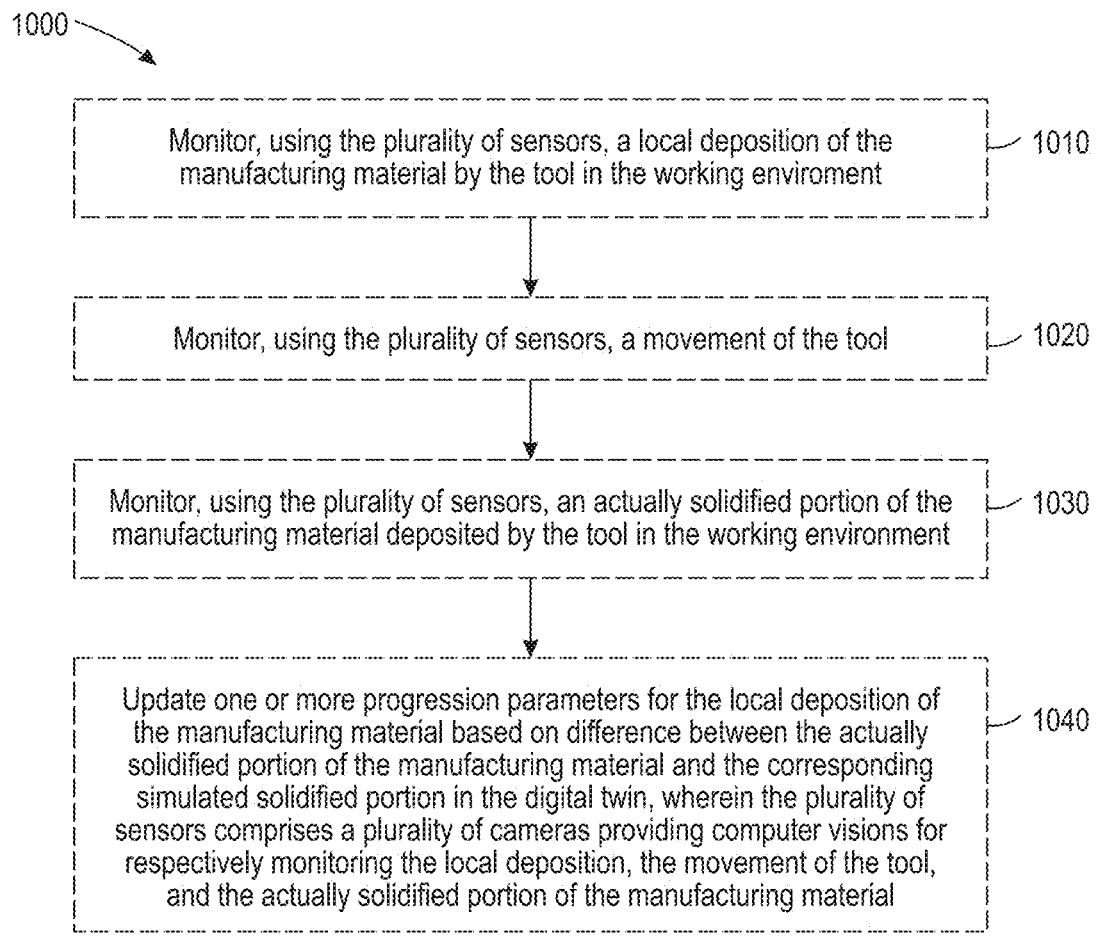

Turning now to FIG. 10, the processing device may execute the manufacturing production task using the tool in the working environment based on the one or more production parameters identified in the digital twin by performing one of the following operations 1000.

At 1010, the processing device monitor, using multiple sensors, a local deposition of the manufacturing material by the tool in the working environment.

At 1020, the processing device may monitor, using multiple sensors, a movement of the tool.

At 1030, the processing device may monitor, using multiple sensors, an actually solidified portion of the manufacturing material deposited by the tool in the working environment.

At 1040, the processing device may update one or more progression parameters for the local deposition of the manufacturing material based on a difference between the actually solidified portion of the manufacturing material and a corresponding simulated solidified portion in the digital twin. The multiple sensors may include a number of cameras providing computer visions for respectively monitoring the local deposition, the movement of the tool, and the actually solidified portion of the manufacturing material.

In some cases, the sensors further include a pyrometer for measuring a global heat transfer in the working environment and providing measurements of the global heat transfer to a corresponding simulation of the local deposition in the digital twin for updating the one or more production parameters.

In some cases, executing the manufacturing production task may include at least one of: performing additive manufacturing; or performing subtractive manufacturing using multiple tools to remove material added during or after the additive manufacturing.

In some cases, representing the manufacturing system using the digital twin may include: retrieving, in a computational infrastructure, previous production parameters and system test results of the manufacturing system; performing the simulation in the digital twin based on the previous production parameters and system test results; and updating, based on the simulation, the one or more production parameters to apply in the working environment, the tool, or both. The computational infrastructure may include one or more application programming interfaces (APIs) to communicate changes of multiple physical components of the manufacturing system and corresponding digital representations in the digital twin.

Figure 11:
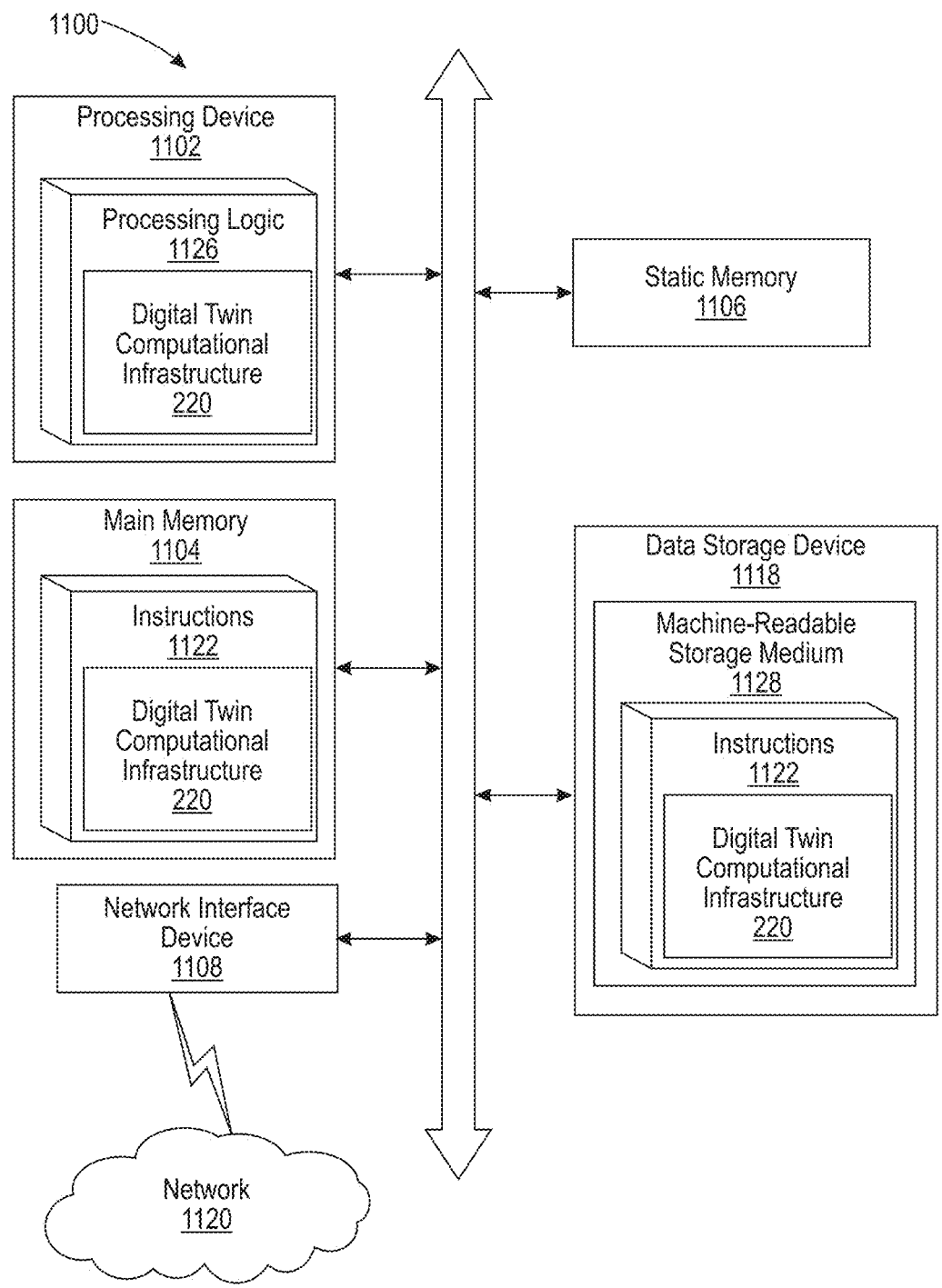
FIG. 11 illustrates a flow diagram of methods of operations by a manufacturing system including a digital twin computational infrastructure, in accordance with certain aspects of the present disclosure.

FIG. 11 illustrates a diagrammatic representation of a machine in the example form of a computer system 1100 within which a set of instructions 1122, for causing the machine to perform any one or more of the methodologies discussed herein (such as the operations 900-1300), may be executed. In various embodiments, the machine may be connected (e.g., networked) to other machines in a local area network (LAN), an intranet, an extranet, or the Internet. The machine may operate in the capacity of a server or a client machine in a client-server network environment, or as a peer machine in a peer-to-peer (or distributed) network environment.

The machine may be a personal computer (PC), a tablet PC, a set-top box (STB), a Personal Digital Assistant (PDA), a cellular telephone, a web appliance, a server, a network router, a switch or bridge, a hub, an access point, a network access control device, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. In one embodiment, computer system 1100 may be representative of a server computer system, such as the manufacturing system digital twin 130, the digital twin computational infrastructure 220, or the digital twin 500.

The exemplary computer system 1100 includes a processing device 1102, a main memory 1104 (e.g., read-only memory (ROM), flash memory, dynamic random access memory (DRAM), a static memory 1106 (e.g., flash memory, static random access memory (SRAM), etc.), and a data storage device 1118, which communicate with each other via a bus 1130. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Processing device 1102 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 1102 may also be one or more special-purpose processing devices such as an application specific integrated circuit (ASIC), a field programmable gate array (FPGA), a digital signal processor (DSP), network processor, or the like. The processing device 1102 may execute processing logic 1126, which may be one example of system 100 shown in FIG. 1, for performing the operations and steps discussed herein, such as the operation 1000 of FIG. 10. In some cases (not shown), the processing logic 1126 may include the manufacturing system digital system 130 of FIG. 1.

The data storage device 1118 may include a machine-readable storage medium 1128, on which is stored one or more set of instructions 1122 (e.g., software) embodying any one or more of the methodologies of functions described herein, including instructions to cause the processing device 1102 to execute system 100. For example, the instructions 1122 may include or be part of the digital twin computational infrastructure 220 (e.g., commands or executables for realizing various functions of the digital twin computational infrastructure 220). The instructions 1122 may also reside, completely or at least partially, within the main memory 1104 or within the processing device 1102 during execution thereof by the computer system 1100; the main memory 1104 and the processing device 1102 also constituting machine-readable storage media. The instructions 1122 may further be transmitted or received over a network 1120 via the network interface device 1108.

The non-transitory machine-readable storage medium 1128 may also be used to store instructions to perform the methods and operations described herein. While the machine-readable storage medium 1128 is shown in an exemplary embodiment to be a single medium, the term "machine-readable storage medium" should be taken to include a single medium or multiple media (e.g., a centralized or distributed database, or associated caches and servers) that store the one or more sets of instructions. A machine-readable medium includes any mechanism for storing information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; or another type of medium suitable for storing electronic instructions.

The computer system 1100 may be implemented as various systems or methods, to develop digital twins of manufacturing (e.g., 3DP) processes/parts, to characterize or qualify processes/parts by at least one or a combination of simulation (physics-based, data-driven, or hybrid), data assimilation (online or offline learning, using multi-modal sensing), and diagnosis/prognosis for 3DP. In some cases, only nominal machine state is considered. In some cases, the variability from one machine to another, or from one build to another on the same machine is considered. In some cases, the uncertainties are quantified and propagated by confidence intervals or probability distributions (using sampling etc.). In some cases, the uncertainties are related to droplet specs (e.g., size/shape, temperature, velocity). In some cases, the sampling is performed using Monte-Carlo based techniques in combination with variance reduction techniques. In some cases, the uncertainties in control variables are ranked in terms of their effects on output quantities of interest (e.g., via a variance-based or moment-independent global sensitivity analysis).

As mentioned above, the manufacturing process may include metal 3D printing such as metal jetting or laser sintering. In some cases, the metal production process uses a magnetohydrodynamic (MHD) melting and pumping process in conjunction with a CNC motion system. In some cases, the manufacturing method or system may represent and parameter-tune a virtual controller of the PDT representing the machine to achieve desired or near-optimal properties. In some cases, the virtual controller compensates for expected deviations from the desired outcome, where one possible compensation is job cessation.

In some cases, the virtual and/or physical surface profilometry data is used to determine when virtual and/or physical part outcome of the 3DP part falls outside of a nominal range of values, and provides this info to a controller to correct the printing on-the-fly. In some cases, the virtual and/or physical surface profilometry is compared with an estimated as-built surface from an intermediate IDT. In some cases, the estimated as-built surface is generated via on a simple model of tool-paths and extrusion rates. In some cases, the estimated as-built surface is generated via an operator learning model based on tool-paths and extrusion rates. In some cases, the estimated as-built surface is generated via a convolution model based on tool-paths and extrusion rates. In some cases, the estimated as-built surface is generated via a multi-physics model based on tool-paths and extrusion rates.

In some examples, the virtual and/or physical part outcome is porosity. In some cases, the virtual and/or physical part outcome is surface roughness. In some cases, the virtual and/or physical part outcome is fatigue metrics. In some cases, the virtual and/or physical part outcome is tensile strength. In some cases, the virtual and/or physical part outcome is crack likelihood. In some cases, the virtual and/or physical part outcome is time-to-failure. In some cases, the virtual and/or physical part outcome is net-part shape. In some cases, the manufacturing system includes both the physical system and a corresponding digital twin that enable tuning inputs or adjust process parameters to achieve desired or near-optimal properties.

In some examples, the input to be tuned is the engineering design of the part: to achieve desired or near-optimal properties in fewer physical trial-and-error iterations. In some cases, the tuned design compensates for expected deviations from the desired outcome. In some cases, machine learning or operator learning is used to predict part quality. The predicted quality is used as a proxy for desired outcome. In some cases, the input to be tuned may include the manufacturing plan. For example, the manufacturing plan may include the orientation of the part, support structure, toolpath plans and extrusion rates. In some cases, the plan is deployed to a 3D printing system.

In some examples, the manufacturing system and its digital twin enable parameter-tune a PDT function (e.g., for tuning or identifying improved or optimized production parameters). In some cases, some of the manufacturing system may be updated or re-designed to optimize the 3DP process (e.g., physical components updates based on simulation results in the digital twin). In some cases, for example, a linearized Navier-Stokes model is solved in variational form using finite elements, yielding a fast way to compute the eigenmodes of the meniscus oscillation and enable one or more re-designs of the nozzle outlet to increase the meniscus damping rate and increase jetting stability at higher throughput.

The preceding description sets forth numerous specific details such as examples of specific systems, components, methods, and so forth, in order to provide a good understanding of several embodiments of the present disclosure. It may be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular embodiments may vary from these exemplary details and still be contemplated to be within the scope of the present disclosure.

Additionally, some embodiments may be practiced in distributed computing environments where the machine-readable medium is stored on and or executed by more than one computer system. In addition, the information transferred between computer systems may either be pulled or pushed across the communication medium connecting the computer systems.

Embodiments of the claimed subject matter include, but are not limited to, various operations described herein. These operations may be performed by hardware components, software, firmware, or a combination thereof.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent or alternating manner.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art may recognize. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Furthermore, the terms "first," "second," "third," "fourth," etc. as used herein are meant as labels to distinguish among different elements and may not necessarily have an ordinal meaning according to their numerical designation.

It may be appreciated that variants of the above-disclosed and other features and functions, or alternatives thereof, may be combined into may other different systems or applications. Various presently unforeseen or unanticipated alternatives, modifications, variations, or improvements therein may be subsequently made by those skilled in the art which are also intended to be encompassed by the following claims. The claims may encompass embodiments in hardware, software, or a combination thereof.

What is claimed is:

1. A method for manufacturing parts, the method comprising:
   representing a manufacturing system using a digital twin, wherein representing the manufacturing system comprises modeling, in the digital twin, digital representations that respectively correspond to a plurality of physical components of the manufacturing system, the plurality of physical components including at least: a manufacturing material, a working environment for deposition of the manufacturing material, a tool to manipulate the manufacturing material between at least two matter states in the working environment, and a plurality of sensors respectively measuring behaviors of the tool, the working environment, and the manufacturing material, wherein at least one of the digital representations corresponding to the working environment models a building platform and ambient temperature control based on measurements by the plurality of sensors respectively measuring behaviors of the tool, the working environment, and the manufacturing material;
   receiving a manufacturing production task;
   performing, in the digital twin, a simulation of the manufacturing production task to identify one or more production parameters to apply in the working environment, the tool, or both; and
   executing the manufacturing production task using the tool in the working environment based on the one or more production parameters identified in the digital twin, wherein the digital twin represents the manufacturing system in a progression state including local representations of coalescence properties, and a global heat transfer state that includes a global representation of the manufacturing production task, both the local representation and the global representation in communication with a global state of an as-printed part of the manufacturing production task, the as-printed part monitored by the plurality of sensors and simulated in the digital twin.

2. The method of claim 1, further comprising:
   monitoring the manufacturing production task using the plurality of sensors;
   based on measurements by the plurality of sensors, updating, in the digital twin, the one or more production parameters in the simulation of the manufacturing production task; and
   updating the executing the manufacturing production task based on the updated one or more production parameters identified in the digital twin.

3. The method of claim 2, wherein performing, in the digital twin, the simulation of the manufacturing production task comprises:
   simulating a deposition of the manufacturing material in a liquid state under a first set of thermal conditions;
   simulating a solidification of the manufacturing material under a second set of thermal conditions; and
   comparing a simulated solidified portion of the manufacturing material to a corresponding characteristic in the manufacturing production task.

4. The method of claim 3, wherein performing, in the digital twin, the simulation of the manufacturing production task to identify the one or more production parameters comprises:
   based on a difference between the simulated solidified portion of the manufacturing material and the corresponding characteristic in the manufacturing production task, updating the first set of thermal conditions, the second set of thermal conditions, or both;
   updating, based on the updated first set of thermal conditions, the updated second set of thermal conditions, or both, the simulated solidified portion of the manufacturing material; and
   upon determining that the difference between the updated simulated solidified portion of the manufacturing material and the corresponding characteristic in the manufacturing production task is smaller than a threshold value, identifying the one or more production parameters based on the updated first set of thermal conditions, the updated second set of thermal conditions, or both.

5. The method of claim 4, wherein the corresponding characteristic comprises at least one of:
   a corresponding geometry;
   a corresponding porosity;
   a corresponding surface roughness;
   a corresponding fatigue property;
   a corresponding tensile strength property; or
   a corresponding stress level.

6. The method of claim 4, wherein executing the manufacturing production task using the tool in the working environment based on the one or more production parameters identified in the digital twin comprises:
   monitoring, using the plurality of sensors, a local deposition of the manufacturing material by the tool in the working environment;
   monitoring, using the plurality of sensors, a movement of the tool;
   monitoring, using the plurality of sensors, an actually solidified portion of the manufacturing material deposited by the tool in the working environment; and updating one or more progression parameters for the local deposition of the manufacturing material based on a difference between the actually solidified portion of the manufacturing material and a corresponding simulated solidified portion in the digital twin, wherein the plurality of sensors comprises a plurality of cameras providing computer visions for respectively monitoring the local deposition, the movement of the tool, and the actually solidified portion of the manufacturing material.

7. The method of claim 6, wherein the plurality of sensors further comprises a pyrometer for measuring a global heat transfer in the working environment and providing measurements of the global heat transfer to a corresponding simulation of the local deposition in the digital twin for updating the one or more production parameters.

8. The method of claim 1, wherein the tool comprises at least one of:
   a deposition unit comprising a heating element and a deposition nozzle to melt and deposit the manufacturing material in the working environment, wherein the manufacturing material comprises a molten form of metal, glass, or thermoplastic; or
   a sintering unit comprising a layering mechanism and a laser to fuse a layer of the manufacturing material in the working environment, wherein the manufacturing material comprises a powder form of metal, glass, or thermoplastic.

9. The method of claim 1, wherein executing the manufacturing production task comprises at least one of:
   performing additive manufacturing; or
   performing subtractive manufacturing using a plurality of tools to remove material added during or after the additive manufacturing.

10. The method of claim 1, wherein representing the manufacturing system using the digital twin comprises:
    retrieving, in a computational infrastructure, previous production parameters and system test results of the manufacturing system;
    performing the simulation in the digital twin based on the previous production parameters and system test results; and
    updating, based on the simulation, the one or more production parameters to apply in the working environment, the tool, or both, wherein the computational infrastructure comprises one or more application programming interfaces (APIs) to communicate changes of the plurality of physical components of the manufacturing system and corresponding digital representations in the digital twin.

11. A non-transitory computer-readable storage medium having instructions stored thereon that, when executed by a processing device for manufacturing parts, cause the processing device to:
    represent a manufacturing system using a digital twin, wherein representing the manufacturing system comprises modeling, in the digital twin, digital representations that respectively correspond to a plurality of physical components of the manufacturing system, the plurality of physical components including at least: a manufacturing material, a working environment for deposition of the manufacturing material, a tool to manipulate the manufacturing material between at least two matter states in the working environment, and a plurality of sensors respectively measuring behaviors of the tool, the working environment, and the manufacturing material, wherein at least one of the digital representations corresponding to the working environment models a building platform and ambient temperature control based on measurements by the plurality of sensors respectively measuring behaviors of the tool, the working environment, and the manufacturing material;
    receive a manufacturing production task;
    perform, in the digital twin, a simulation of the manufacturing production task to identify one or more production parameters to apply in the working environment, the tool, or both; and
    execute the manufacturing production task using the tool in the working environment based on the one or more production parameters identified in the digital twin, wherein the digital twin represents the manufacturing system in a progression state including local representations of coalescence properties, and a global heat transfer state that includes a global representation of the manufacturing production task, both the local representation and the global representation in communication with a global state of an as-printed part of the manufacturing production task, the as-printed part monitored by the plurality of sensors and simulated in the digital twin.

* * * * *